United States Patent [19]

Hashimoto et al.

[11] 3,856,588

[45] Dec. 24, 1974

[54] STABILIZING INSULATION FOR DIFFUSED GROUP III-V DEVICES

[75] Inventors: Masafumi Hashimoto; Yasuo Shimura, both of Kawasaki, Japan

[73] Assignee: Matsushita Electric Industrial Company, Limited, Osaka, Japan

[22] Filed: Oct. 10, 1973

[21] Appl. No.: 405,096

[30] Foreign Application Priority Data

| | | |
|---|---|---|
| Oct. 11, 1972 | Japan | 47-102123 |
| Oct. 11, 1972 | Japan | 47-102124 |
| Oct. 11, 1972 | Japan | 47-102125 |

[52] U.S. Cl. .................. 148/188, 148/1.5, 148/186, 148/188, 252/62.3 GA, 117/201

[51] Int. Cl. .............................................. H01l 7/34

[58] Field of Search ..................... 148/188, 187, 1.5; 252/62.3 GA; 117/201

[56] References Cited

UNITED STATES PATENTS

| | | | |
|---|---|---|---|
| 3,615,943 | 10/1971 | Genser | 148/188 |
| 3,697,338 | 10/1972 | Asai et al. | 148/188 |

*Primary Examiner*—G. Ozaki

[57] ABSTRACT

An oxide layer containing an impurity element is formed on selected areas of a surface of a III–V compound semiconductor wafer. Another oxide layer containing a Group III metal is then formed thereover to inhibit diffusion of metal atoms from the wafer during subsequent heating for impurity diffusion.

7 Claims, 6 Drawing Figures

Fig. 4
Fig. 3
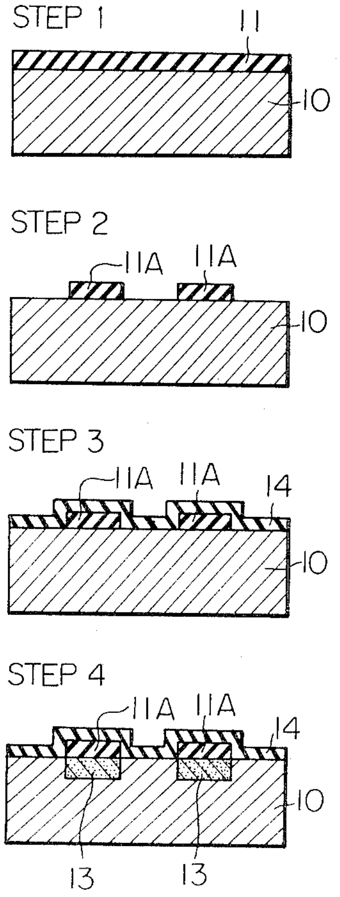
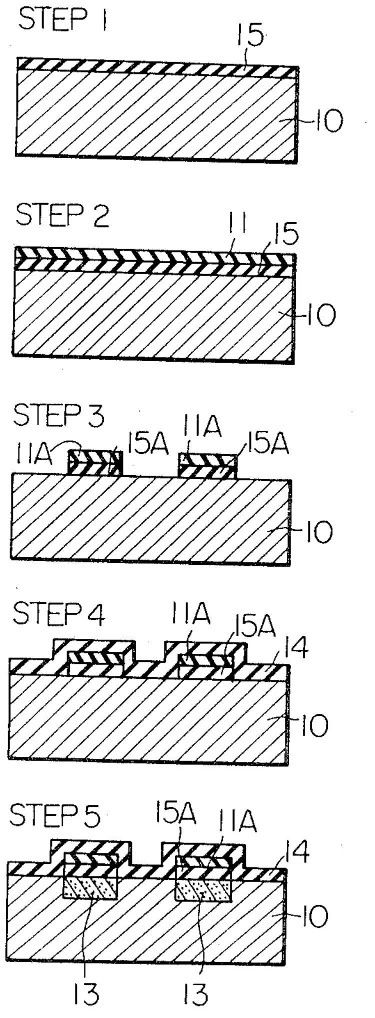

STABILIZING INSULATION FOR DIFFUSED GROUP III-V DEVICES

The present invention relates to a method of forming diffused junctions in a semiconductor wafer, and more particularly to a method of diffusing an impurity element into a compound semiconductor wafer by solid-to-solid diffusion.

In the fabrication of a semiconductor element from a wafer formed of a compound semiconductor such as GaAs, GaAsP, GaP or InP, required junctions, which may be P-N, P-$P^+$, N-P or N-$N^+$, have been formed by diffusing a donor or an acceptor impurity element into the wafer. The so-called solid-to-solid diffusion method has been preferred among various diffusion methods. This method is characterized both by adequate quality of the obtained junctions and by efficiency of the procedure as typically exemplified in U.S. Pat. No. 3,615,943. There is, however, a problem of relatively weak dielectric strength between the diffused junctions. The problem is considered to be caused by an unstable surface state due to out-diffusion of metal atoms from the wafer.

A prior art method of forming diffused junctions in a semiconductor wafer will now be described referring to the accompanying drawings, in which:

FIG. 3 shows schematic cross-sectional views of a semiconductor element formed by a first preferred method of the invention;

FIG. 4 is similar to FIG. 3 and illustrates a second preferred method of the invention;

Figure 1:
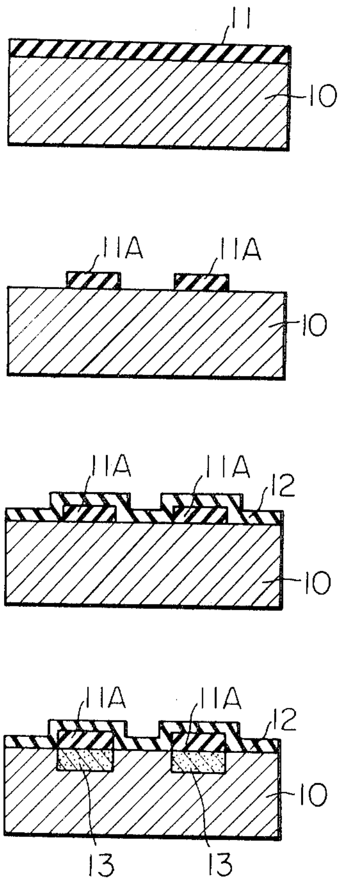
Fig. 1 PRIOR ART
FIG. 1 shows schematic cross-sectional views of a semiconductor element formed by a prior art method.

A solution is prepared by dissolving a silicon acetate compound and an impurity element to be diffused, for example Zn in a Zn compound form, in an inert solvent such as ethanol. The solution is applied on a surface of an N-type GaAs wafer 10 in FIG. 1 by a conventional method such as the spinner method. The coated wafer 10 is heated in air at 250°C for 15 minutes or more to decompose the silicon acetate compound in the solution into $SiO_2$. Areas of a thus formed first oxide layer 11, which contains Zn, are selectively removed by a conventional etching method using a mask, leaving required regions 11A for the diffusion of Zn. The exposed surface areas of the wafer 10 and the regions 11A of the first oxide layer 11 are again coated with a solution of silicon acetate compound in an inert solvent. The solution for this application contains, at least intentionally, no impurity element. Upon heating the coated wafer 10 under the same conditions as with the first heating, the silicon acetate compound decomposes to produce a second oxide layer 12 of pure $SiO_2$. After that, the wafer 10 with the oxide layers 11A and 12 is heat treated in an open quartz tube in a stream of $N_2$ gas or a mixed gas of about 93% $N_2$ and about 7% $H_2$ by volume, at a high temperature of about 850°C, for a period of time sufficient to permit the Zn in the regions 11A to diffuse into the wafer 10 to the desired depth. Thus, impurity diffused regions 13, which are Zn doped P-type regions in this case, are formed in the N-type GaAs wafer 10.

Figure 2:
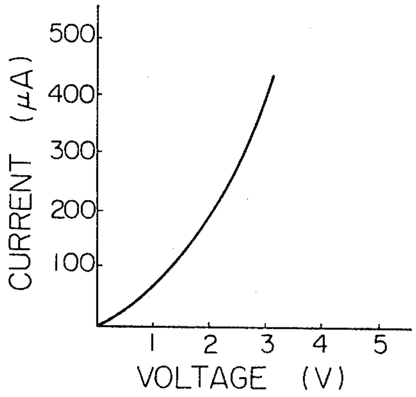
Fig. 2 PRIOR ART
FIG. 2 is a graph of the leakage current vs. applied voltage of the element shown in FIG. 1.

Unfortunately the GaAs wafer 10 having thus formed P-type regions 13 does not show high dielectric strength between the P-type regions 13. As seen from FIG. 2, a considerable leakage current is observed even at a voltage far lower than the breakdown voltage expected from the electron density in the N-type GaAs wafer 10. The poor dielectric property is considered to be caused by the following phenomena: During the impurity diffusion process, some of the Ga atoms in the surface region of the GaAs wafer 10 diffuse into the overlying $SiO_2$ layer 12 because of the high temperature of 850°C. As a result, some defects arise in the surface region of the GaAs wafer 10. These defects lead to an unstable surface state and reduced dielectric strength. In addition to the poor insulation between the P-type regions 13, the defects also bring about a reduced reverse-bias breakdown voltage at each P-N junction.

An improved method to eliminate the above mentioned disadvantages has been proposed comprising the formation of a protective layer of $Si_3N_4$. According to the proposed method, a second oxide layer of a silicon nitride or an oxysilicon nitride, for example trisilicon tetranitride $Si_3N_4$, is formed on the surface of the compound semiconductor wafer after the selective formation of a first oxide layer containing an impurity element. Thereafter, the diffusion process is performed by the usual heating method. Since the layer of $Si_3N_4$ prevents any diffusion thereinto far more strongly than the conventional $SiO_2$ layer, both diffusion of Ga or As from the wafer and diffusion of foreign ions from the surrounding atmosphere are eliminated almost completely under usual conditions for the solid-to-solid diffusion method. Consequently, the surface region is free from the aforementioned defects and maintains its normal and stable state.

This improved method, however, has some disadvantages such as difficulty of fabrication and the inherent undersirable properties of the produced layer. In forming a layer of a silicon nitride or its derivative, for example $Si_3N_4$, the wafer is placed in a reaction tube at 500°C, and a mixed gas of $SiH_4$, $NH_3$ and Ar is passed through the tube. The $SiH_4$and $NH_3$ are decomposed in the tube to produce $Si_3N_4$, which is deposited on the surface of the wafer and the oxide layer until a layer of about 250 A thick is formed. Conditions for the reaction must be strictly controlled because the property of $Si_3N_4$ layer tends to change with variations in forming conditions. The slow grow rate of the layer requires a long production time. Furthermore, the $Si_3N_4$ layer exerts a strong compressive force on the wafer, sometimes causing excessive diffusion into the wafer, and a tendency of cracks in the $Si_3N_4$ layer arises when it is deposited relatively thick.

It is therefore an object of the present invention to provide a method of forming impurity diffused junctions in a compound semiconductor wafer by solid-to-solid diffusion, which can be efficiently performed on a mass-production basis, and which provides a semiconductor element having high dielectric strength between adjacent junctions, and junctions with a high reverse-bias breakdown voltage owing to a high surface stability.

This and other objects, features and advantages of the invention will become more clear from the following detailed description taken in conjunction with the accompanying drawings.

In accordance with a method of the invention, a second oxide layer that contains a metal which is a constituent of the compound semiconductor wafer to be treated is formed on the wafer after a first oxide layer that contains an impurity to be diffused into the wafer was formed on selected areas of the wafer surface. Due to the existence of the selected metal in the second oxide layer, diffusion of any matter from the wafer is strongly inhibited during and after a heating process for the diffusion of the impurity.

The methods of the invention will now be described more in detail referring to the drawings. The wafer 10 in FIG. 3 is a III–V compound semiconductor, formed of GaAs, GaAsP, GaP or InP. A surface of the wafer 10 is at first coated with the first oxide layer 11. The layer 11 contains a donor or acceptor impurity element to be diffused, for example Zn or Te, and may be formed by any conventional method, preferably by the application of a suitable solution and a subsequent heating. Portions of the layer 11 are then selectively removed leaving the desired regions 11A by a conventional etching method using a mask. Then the second oxide layer 14 containing a Group III metal which is a constituent of the wafer 10, for example Ga for a GaAs wafer, is formed on the exposed surface areas of the wafer 10 and the surfaces of the regions 11A of the first oxide layer 11. The layer 14 is preferably formed by first applying a solution consisting of an inert organic solvent, a silicon acetate compound and a compound of the selected metal onto the above mentioned surfaces, and by subsequent heating in air to decompose the silicon acetate compound into $SiO_2$. After that, the impurity diffused regions 13 are formed in the wafer 10 by conventional heat treatment of the coated wafer 10.

The important feature of the method of the invention is the formation of the second oxide layer 14 that contains the aforementioned particular metal. The layer 14 or the metal on it inhibits the diffusion of metal atoms from the surface of the wafer 10 into the layer 14 as already described. The atomic concentration of the metal atoms in the layer 14 is preferably from $10^{19}$ to $10^{21}$ $cm^{-3}$ in the case of Ga. The second oxide layer 14 is also effective in preventing the diffusion of the impurity in the first oxide layer 11 into the surrounding atmosphere, and diffusion of foreign ions from the atmosphere into the wafer 10 during the heat treatment. Thus, it is possible to fabricate improved semiconductor elements having higher surface stability, dielectric strength between diffused junctions, reverse-bias breakdown voltage at each junction, and uniformity of each element. The method of the invention is useful in fabricating light-emitting diodes and field-effect transistors of improved quality. Another advantage of the method of the invention is simplicity in forming the oxide layers including the second oxide layer 14. Each layer can be formed easily by the conventional spinner method, requiring no special or costly apparatus. The heat treatment for impurity diffusion can also be carried out in a simple open-tube. Besides, the concentration of the impurity element or the inhibiting metal in an oxide may be easily varied as required by merely varying the concentration of the solution.

The effect of the second oxide layer 14 of the invention is surprising as seen from the above description, but a few minor problems arise in certain particular cases. When an impurity diffusion of relatively shallow depth is performed by the above described method of the invention, there is a possibility of diffusion of metal atoms from the wafer 10 into the regions 11A of the first oxide layer 11 although diffusion into the second oxide layer 14 is inhibited. This out-diffusion also causes the surface defects in the diffusion regions 13, and consequently makes it difficult to achieve an impurity diffusion of uniform depth. In another case when the impurity in the first oxide layer 11 is in a considerably high concentration, there arise two problems; firstly, the impurity reacts with the wafer 10, and secondly the adhesive strength between the first oxide layer 11 and the wafer 10 decreases. To solve these problems, another method of the invention is provided.

Referring now to a second method of the invention shown in FIG. 4, a third oxide layer 15 is at first formed on the surface of the wafer 10. The layer 15 contains the same metal as the aforementioned second oxide layer 14, and it is formed in a similar manner as the second oxide layer 14. Then the first oxide layer 11 that contains an impurity is formed on the layer 15. Selective removal of areas of the oxide layers 11 and 15, formation of the second oxide layer 14 containing the previously described metal, and the final heat treatment for impurity diffusion are carried out in order, as described before. In the resultant element, the outer surfaces of the impurity diffused regions 13 are directly coated with the unremoved regions 15A of the third oxide layer 15A, while the other areas of the surface of the wafer 10 are covered by the second oxide layer 14. The unremoved regions 15A of the third oxide layer 15 inhibit metal diffusion from the wafer 10 into the impurity-containing regions 11A due to the contained metal, and at the same time prevent the before mentioned undesirable phenomena by separating the impurity-containing regions 11A from the wafer 10. The thickness of the layer 15 must be great enough to prevent diffusion from the wafer 10 into the regions 11A, but not so great as to prevent diffusion from the regions 11A into the wafer 10. In case the oxide is $SiO_2$, the preferable thickness of the layer 15 is from 500 to 1,500 A.

Figure 5:
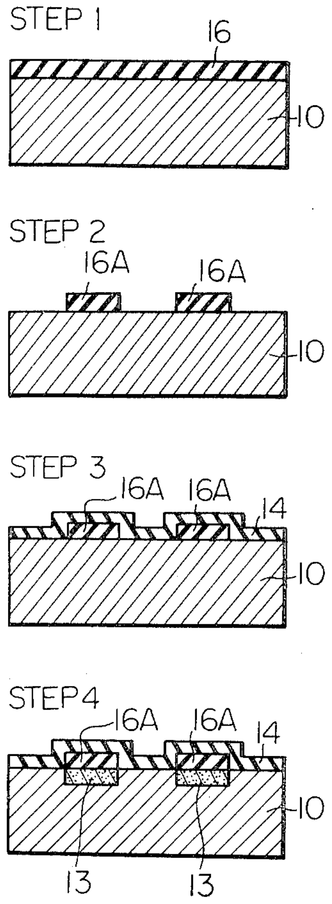
FIG. 5 is similar to FIG. 3 and illustrates a third preferred method of the invention; and, FIG. 6 is a graph of the leakage current vs. applied voltage of semiconductor elements formed by the methods of FIG. 1 and FIG. 3.

In some cases, the inhibition of the metal diffusion from the regions 13 is also accomplished by a third method of the invention, which does not require the extra step of forming the third oxide layer 15. A modified first oxide layer 16 in FIG. 5 contains both a selected metal of Group III, which is a constituent of the wafer 10, and an impurity to be diffused. The procedure of forming the layer 16 is similar to the procedure for the previous first oxide layer 11 except for the addition of a compound of the selected metal to the solution. Subsequent steps of removing areas of the layer 16 to leave only the required regions 16A, forming the second oxide layer 14 and the final heat treatment to form the impurity diffused regions 13 are all carried out as previously described referring to FIG. 3. It will be easily understood that the existence of a Group III metal in the unremoved regions 16A of the modified first oxide layer 16 prevents the diffusion of metal atoms thereinto from the regions 13 of the wafer. Any diffusion from or into the remaining portion of the wafer surface is inhibited by the overlaid second oxide layer 14 in every method of the invention.

The present invention will be further illustrated by the following examples, which should not be considered as limiting the scope of the invention.

EXAMPLE 1

An N-type semiconductor wafer of GaAs doped with Te to give an electron density of $2 \times 10^{16}$ $cm^{-3}$ was used. A surface of the wafer, namely the face (100) was lapped to a high finish and further polished with an etching liquid comprising $H_2SO_4$, $H_2O_2$ and water. The polished surface was coated with "Zincsilicafilm Solution" of EMULSIONE COMPANY of Millburn, N.J. which is a solution of a silicon acetate compound and a compound of zinc in an inert organic solvent, with a spinner type apparatus. Then the coated wafer was heated in air at 200°C for 15 minutes to decompose the silicon acetate compound into silicon dixoide. The formed $SiO_2$ layer was about 2,300 A thick and contained Zn at an atomic concentration of $10^{21}$ $cm^{-3}$. Unnecessary areas of the $SiO_2$ layer were removed by etching with 10% aqueous solution of hydrofluoric acid using a mask of acid-proof resin.

After that, "Galliumsilicafilm Solution" of EMULSIONE COMPANY, which is a solution of a silicon acetate compound, a compound of gallium and an inert organic solvent, was applied with a spinner type apparatus onto the exposed surface of the wafer and the unremoved regions of the $SiO_2$ layer. By heating the coated wafer in air at 200°C for 15 minutes, the second $SiO_2$ layer about 2,000 A thick was formed containing Ga atoms in a concentration of $10^{20}$ $cm^{-3}$.

Thereafter the wafer was placed in an open-tube and heated at 800°C in a stream of a mixed gas of about 93 parts $N_2$ and about 7 parts $H_2$ for about 15 minutes, until Zn-diffused P-type regions were formed about 5.5 microns deep in the wafer by diffusion of Zn from the unremoved regions of the first $SiO_2$ layer. The atomic concentration of Ga in the surface of the diffused regions was on the order of $10^{20}$ $cm^{-3}$.

Figure 6:
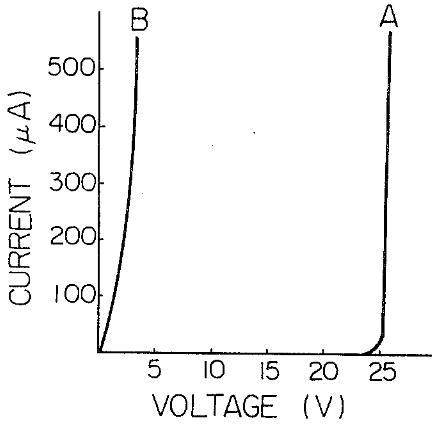

The voltage-current relationship between the thus formed P-type regions in the wafer was measured and the result is illustrated in FIG. 6 by a curve A. No leakage current was observed until the applied voltage was increased up to the breakdown voltage of the wafer. The improved performance will be clearly understood by a comparison between the curve A and a curve B, which represents the result with diffused regions formed by the prior art method.

EXAMPLE 2

An N-type semiconductor wafer of GaAs : Te was the same as in Example 1, and the surface (100) was lapped and cleaned similarly. At first "Galliumsilicafilm Solution" of EMULSIONE COMPANY was applied on the polished surface of the wafer with a spinner type apparatus. After heating in air at 250°C for 15 minutes, a layer of $SiO_2$ was formed about 1,000 A thick, containing Ga in an atomic concentration of $3 \times 10^{20}$ $cm^{-3}$. Next, a layer of $SiO_2$ containing Zn atoms in a concentration of $10^{21}$ $cm^{-3}$ was formed about 2,300 A thick on the preformed $SiO_2$ layer by the same procedure as for the Zn-containing $SiO_2$ layer in Example 1. If the Zn concentration in the $SiO_2$ layer is required to be as high as $10^{22}$ $cm^{-3}$, a wafer coated with the above mentioned Ga-containing $SiO_2$ layer must be re-heated in nitrogen atmosphere at 450°C for 30 minutes before applying the Zn-containing solution. Areas of the two $SiO_2$ layers were selectively removed simultaneously by the same etching method as in Example 1. On the exposed surface of the wafer and the unremoved regions of the $SiO_2$ layers, a layer of $SiO_2$ containing Ga was formed about 2,000 A thick in a similar manner as the second $SiO_2$ layer in Example 1. Then the wafer was heat treated in an open tube under the same condition as in Example 1, and P-type regions doped with Zn in an atomic concentration of $10^{20}$ $cm^{-3}$ at the surface were formed about 3 microns deep in the wafer.

EXAMPLE 3

On the polished surface (100) of the same GaAs : Te wafer as in the above examples, a mixed solution of "Zincsilicafilm Solution" and "Galliumsilicafilm Solution" was applied. The coated wafer was heated in air at 200°C for 15 minutes to produce a 2,300 A thick layer of $SiO_2$ containing Zn and Ga at atomic concentrations of $10^{21}$ $cm^{-3}$ and $10^{20}$ $cm^{-3}$ respectively. Thereafter, the steps of selectively removing the $SiO_2$ layer, forming the second $SiO_2$ layer containing Ga, and heating in an open tube were carried out similar to Example 1. The produced P-type regions were about 3 microns deep, and the Zn concentration was $10^{20}$ $cm^{-3}$ at the surface.

The diffused junctions produced in Examples 2 and 3 also showed excellent and uniform performance due to the stable state of the surface.

Although Zn was used as an impurity throughout the above examples, Cd also can be diffused into an N-type GaAs wafer with good results by any embodiment of the invention. The diffusion of Se or Sn into a P-type GaAs wafer can also be performed in a similar manner. The methods of the invention are not limited to a GaAs semiconductor but applicable to other III–V compound semiconductors such as GaAsP, GaP and InP. It will be understood without further explanation that the metal of Group III contained in the oxide layers of the invention should be determined according to the composition of the wafer; In should be employed for a InP wafer.

As for the method of forming oxide layers that contain an impurity and/or the selected metal of Group III, any conventional methods such as sputtering, vapor growth or heat decomposition may be used in place of the above mentioned spinner method or the application of a solution. Furthermore, it is possible to use $Al_2O_3$ as an oxide for the oxide layer of the invention which contains the selected metal.

What is claimed is:

1. A method of forming diffused junctions in a III–V compound semiconductor wafer, comprising the steps of:

forming a first oxide layer containing an impurity element to be diffused on selected areas of a surface of said wafer leaving remaining areas of said surface exposed;

forming a second oxide layer containing a Group III metal over said first oxide layer and exposed said remaining areas of said surface of said wafer, said metal being a constituent of said wafer; and heating said wafer to diffuse said impurity element into said wafer.

2. A method as claimed in claim 1, which further comprises a step of forming a third oxide layer containing said Group III metal on said surface of said wafer prior to said step of forming said first oxide layer.

3. A method as claimed in claim 1, in which said first oxide layer further comprises said Group III metal.

4. A method as claimed in claim 1, in which said wafer is formed of an impurity doped GaAs, and said Group III metal is Ga.

5. A method as claimed in claim 1, in which said second oxide layer comprises $SiO_2$.

6. A method as claimed in claim 5, in which said second oxide layer is formed by applying a solution comprising a gallium compound, a silicon acetate compound and an organic solvent onto said surface of said wafer, and by heating said wafer to decompose said silicone acetate compound into $SiO_2$.

7. A method as claimed in claim 1, in which said second oxide layer comprises $Al_2O_3$.

* * * * *